United States Patent
Hofmann et al.

(10) Patent No.: US 6,608,340 B1
(45) Date of Patent: Aug. 19, 2003

(54) SUBSTRATE ASSEMBLY HAVING A DEPRESSION SUITABLE FOR AN INTEGRATED CIRCUIT CONFIGURATION AND METHOD FOR ITS FABRICATION

(75) Inventors: Franz Hofmann, München (DE); Till Schlösser, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/821,853

(22) Filed: Mar. 30, 2001

Related U.S. Application Data

(63) Continuation of application No. PCT/DE99/02724, filed on Sep. 1, 1999.

(30) Foreign Application Priority Data

Sep. 30, 1998 (DE) .......................................... 198 44 967

(51) Int. Cl.$^7$ ................................................ H01L 29/72
(52) U.S. Cl. ..................... 257/301; 257/67; 257/302; 257/303; 257/304; 257/305; 365/149
(58) Field of Search ................ 438/243–49, 242, 438/386–92; 365/149; 257/301–305, 67

(56) References Cited

U.S. PATENT DOCUMENTS

| | | | |
|---|---|---|---|
| 5,216,266 A | 6/1993 | Ozaki | |
| 5,302,541 A | 4/1994 | Akazawa | |
| 5,365,097 A | 11/1994 | Kenney | |
| 5,376,575 A | 12/1994 | Kim et al. | |
| 5,559,353 A | 9/1996 | Risch et al. | |

FOREIGN PATENT DOCUMENTS

| | | | |
|---|---|---|---|
| DE | 195 19 160 C1 | 9/1996 | |
| EP | 0 333 426 A2 | 9/1989 | |
| EP | 0 333 426 | * 9/1989 | ................. 257/301 |
| EP | 0 852 396 A2 | 7/1998 | |

OTHER PUBLICATIONS

K. Yamada et al.: "A Deep–Trenched Capacitor Technology For 4 Mega Bit Dynamic RAM", IEDM 85, pp. 702–705.

* cited by examiner

Primary Examiner—Edward Wojciechowicz
(74) Attorney, Agent, or Firm—Laurence A. Greenberg; Werner H. Stemer; Ralph E. Locher

(57) ABSTRACT

A depression extends from a main surface of the substrate to the inside of said substrate and has an upper area and an adjacent lower area. A cross-section of the upper area, parallel to the main surface, is provided with at least one corner. A cross-section of the lower area, parallel to the main surface, matches the cross-section of the upper area, particularly in the vicinity the upper area, with the following difference: each corner is rounded, whereby the cross section of the lower area is smaller than the cross-section of the upper area. In order to produce the indentation, the upper area is provided with an auxiliary spacer that is rounded by isotropic etching. The lower area is produced by selectively etching the substrate to form an auxiliary spacer.

4 Claims, 5 Drawing Sheets

SUBSTRATE ASSEMBLY HAVING A DEPRESSION SUITABLE FOR AN INTEGRATED CIRCUIT CONFIGURATION AND METHOD FOR ITS FABRICATION

CROSS-REFERENCE TO RELATED APPLICATION

This application is a continuation of copending International Application No. PCT/DE99/02724, filed Sep. 1, 1999, which designated the United States.

BACKGROUND OF THE INVENTION

Field of the Invention

The invention relates to a substrate having a depression suitable for an integrated circuit configuration and to a method for its fabrication.

In K. Yamada et al. "A deep-trenched capacity technology for 4 megabit dynamic RAM", IEDM (1985) 702, a capacitor disposed in a depression in a substrate is described. In the depression, a capacitor dielectric is produced on surfaces that have no edges. A photolithographic process initially produces the depression with a square cross section. In order to round off the edges, a thermal oxide about fifty nanometers (50 nm) thick is grown and then removed. The capacitor dielectric is then grown by thermal oxidation. The rounding of the edges reduces leakage currents. This is because if a thermal oxide is grown onto a surface which has an edge, the oxide at the edge turns out to be particularly thin, so that leakage currents therefore occur in the region of the edge.

Commonly owned German patent 195 19 160 (which correspond to U.S. Pat. No. 5,817,552) describes a DRAM cell configuration. In this DRAM configuration, a storage capacitor is disposed underneath a transistor. A gate electrode of the transistor and a storage node of the capacitor are disposed in a depression having a square cross section. A surface on which the capacitor dielectric is disposed has edges.

EP 0 852 396 describes a DRAM cell configuration in which a depression in a silicon substrate is produced for one memory cell. First of all, insulating structures are produced in the substrate. Then, bit lines are produced on the substrate. Upper regions of the depressions are produced, silicon being etched selectively with respect to the insulating structures and the bit lines down to a first depth. Then, flanks of the depressions are provided with a layer of $SiO_2$ and a layer of silicon nitride. By anisotropic etching down to a second depth, lower regions of the depressions are produced. The lower regions of the depressions are then broadened by isotropic etching, the layer of $SiO_2$ and the layer of silicon nitride protecting the upper regions. In the lower region of the depression, a storage capacitor of the memory cell is produced. In the upper region of the memory cell, part of a word line is produced, acting as a gate electrode of a transistor belonging to the memory cell.

Kenney (U.S. Pat. No. 5,365,097), Ozaki (U.S. Pat. No. 5,216,266) and EP-A-0 333 426 disclose substrates in which depressions define an upper and a lower region. The upper region has a larger cross-sectional area than the lower region. These regions can contain storage capacitors and switching transistors of memory cells.

SUMMARY OF THE INVENTION

It is accordingly an object of the invention to provide a Substrate assembly having a depression suitable for an integrated circuit configuration and method for its fabrication that overcomes the hereinafore-mentioned disadvantages of the heretofore-known devices of this general type and that specifies a substrate having a depression, which is suitable for an integrated circuit configuration. The depression can be part of a transistor having a control characteristic like those commonly occurring in planar MOS transistors. And, the transistor can be part of a capacitor with a high breakdown voltage.

With the foregoing and other objects in view, there is provided, in accordance with the invention, a substrate assembly having a depression that is suitable for an integrated circuit configuration. The substrate assembly includes a substrate having a main surface and a depression formed therein reaching into the substrate from the main surface. The depression has an upper region, an adjacent lower region with a vicinity near the upper region, a first cross section, a second cross section, and an indentation at a transition from the upper region to the lower region. The first cross section cuts through the upper region parallel to the main surface. The first cross section is substantially square and has at least one corner. The second cross section cuts through the lower region parallel to the main surface. The second cross section corresponds to the first cross section at least in the vicinity. The second cross section is smaller than the first cross section. The second cross section is substantially circular. The second cross section has at least one corner corresponding respectively to the at least one corner of the first cross section. The corners of the second cross section are rounded off.

With the objects of the invention in view, there is also provided a method of fabricating a substrate assembly. The method includes producing a depression in a substrate, starting from a main surface of the substrate. The next step is generating an upper region and an adjacent lower region in the depression. The next step is producing a substantially square first cross section through the upper region parallel to the main surface having at least one corner. The next step is producing a second cross section through the lower region parallel to the main surface and corresponding to the first cross section, at least immediately in a vicinity of the upper region, with each corner being rounded off to make the second cross section substantially smaller than the first cross section. The next step is providing an indentation in the depression at a transition from the upper region to the lower region.

The problem is solved by a substrate having a depression that is suitable for an integrated circuit configuration. In the configuration, the depression reaches into the substrate, starting from a main surface of the substrate. The depression has an upper region and an adjacent lower region. A cross section through the upper region parallel to the main surface has at least one corner. A cross section through the lower region parallel to the main surface corresponds to the cross section of the upper region. This correspondence is at least immediately in the vicinity of the upper region. A difference may be that each corner is rounded off in such a way that the cross section of the lower region is smaller than the cross section of the upper region and the depression has an indentation at the transition from the upper region to the lower region.

The problem is further solved by a method of fabricating a substrate having a depression, which is suitable for an integrated circuit configuration in which the depression is produced in the substrate, starting from a main surface of the substrate. The depression is produced with an upper region and an adjacent lower region. The upper region has a cross section through the upper region parallel to the main surface has at least one corner. The lower region has a cross section through the lower region parallel to the main surface corresponding to the cross section of the upper region, at least immediately in the vicinity of the upper region. A difference can be that each corner is rounded off in such a way that the cross section of the lower region is smaller than the cross section of the upper region and the depression has an indentation at the transition from the upper region to the lower region.

The substrate can include an integrated circuit configuration. In the integrated circuit configuration, a first side surface of the depression, which is located in the upper region, can be part of a first component of the circuit configuration. A second side surface of the depression located in the lower region can be part of a second component of the circuit configuration. Because the first component and the second component are disposed one underneath the other, the circuit configuration can have a high packing density.

Because the cross section of the upper region has at least one corner, the cross section can have a straight edge, and the first surface, which is associated with the edge, can be flat. In this case, the cross section will have at least two corners terminating the edge. The second surface is disposed under the first surface. In the cross section of the lower region, both corners are rounded off. Consequently, the second surface is curved.

The invention is based on the finding that the growth of an oxide layer produced by thermal oxidation on a surface of a substrate depends on the alignment of the surface in relation to the crystal structure of the substrate. If the surface is flat, the oxide layer grows with a homogenous thickness, because the flat surface has a defined alignment in relation to the crystal structure of the substrate, as opposed to a curved surface. If the oxide layer is a gate dielectric of a MOS transistor, the gate dielectric that is grown onto the curved surface does not have a homogeneous thickness. Therefore, different regions of the transistor have different threshold voltages. This leads to inhomogeneous turn-off behavior and, therefore, unfavorable control characteristics of the transistor. These characteristics have a lower below-threshold slope. Because the first surface is flat, the first component can be a vertical transistor, whose control characteristic, with regard to the turn-off behavior, corresponds to that of a conventional planar MOS transistor.

The second component can, for example, be a capacitor whose capacitor dielectric is disposed on the second surface.

The curved second surface enables the lower region of the depression not to have any edges. This occurs if all the corners in the cross section of the lower region are rounded. Not having edges is advantageous because the capacitor dielectric then likewise has no edges. Therefore, edge-induced thin points in the capacitor dielectric, and also field distortions that lead to a reduction in the breakdown voltage of the capacitor, are avoided. In addition, the capacitor dielectric can be produced more easily if no edges must be covered.

Moreover, dislocation defects, which can be produced at edges during a temperature cycle by high notch stresses on account of different expansion coefficients, can be avoided.

For other components, such as micromechanical sensors or actuators, it may also be advantageous to be disposed on a flat surface or on a curved surface or to comprise these. In the depression, for example, a conductive structure may be disposed. In such a configuration, the upper region of the depression acts as part of a component and in the lower region of the depression acts as a contact that leads to a surface of the substrate facing away from the main surface.

The invention is not just suitable for an integrated circuit configuration. It may also be advantageous, for example for mechanical reasons, for the depression to have a flat first surface and a curved second surface which are disposed one under the other. It is possible, for example, for a connecting structure that connects the substrate to another substrate to be disposed in the depression.

In accordance with another feature of the invention, an auxiliary spacer being produced in the depression after the production of the upper region by material being deposited and etched may produce a substrate. Isotropic etching of the auxiliary spacer rounds its edges, so that an exposed part of a base of the depression that adjoins the auxiliary spacer has no corners. The lower region is then produced by the substrate being etched selectively with respect to the auxiliary spacer. Under the auxiliary spacer, the surface of the depression that is substantially parallel to the main surface is produced.

When the edges of the auxiliary spacer are rounded off, parts of the upper region of the depression that are not located in the vicinity of the edges of the upper region can be exposed. The auxiliary spacer then breaks up into parts that are disposed in edges of the upper regions.

The scope of the invention includes the upper region having curved side surfaces in addition to the first surface.

In accordance with another feature of the invention, the auxiliary spacer is partially removed before the production of the lower region. By partially removing the auxiliary spacer, selected parts of the areas of the upper region and of the lower region merge into one another without a step, that is, without an indentation.

In order to increase the packing density, the first surface, which is bounded at the sides by edges of the depression, has a dimension parallel to the main surface that is no greater than the minimum structure size F that can be fabricated in the technology used.

In order to increase the packing density, the cross section of the upper region can be substantially square. The side length of the square is preferably F. The cross section of the lower region is substantially circular; a diameter is equal to or less than F. The lower region of the depression is, for example, cylindrical.

Such an upper region is difficult to produce by a simple masked photolithographic etching process. This is difficult because a lack of sharpness in the photolithography leads to rounding of edges at these small dimensions. The result is that the first surface is curved. The scope of the invention includes producing the upper region by two trenches being produced first with the aid of a strip-like first mask. A distance between the trenches is preferably F. Then, the trenches are filled with structures. To this end, for example, $SiO_2$ can be deposited and etched back. After the production of the structures, the substrate is etched selectively with respect to the structures with the aid of a strip-like second mask. The second mask has at least two strips running transversely with respect to the trenches and having a distance from each other that is preferably F. In this way, the upper region of the depression, which has edges, is produced between the trenches and between the strips. The upper region also can be produced by a different process in such a way that its cross section is square with a side length of F.

In accordance with another feature of the invention, the distance between the trenches and the distance between the strips of the second mask is greater than F, and therefore the cross section of the upper region being greater than $F^2$.

The substrate can include a DRAM cell configuration. The depression is part of a memory cell that includes a vertical transistor and a storage capacitor connected in series with it. The lower region of the depression is provided with a capacitor dielectric. A storage node of the storage capacitor is for the most part disposed in the lower region. The upper region of the depression is provided with a gate dielectric. A gate electrode of the transistor is placed in the upper region on at least the first surface. A lower source/drain region of the transistor is disposed in the substrate and connected electrically to the storage node. An upper source/drain region of the transistor is connected to a bit line. The gate electrode is connected to a word line. The word line and the bit line are preferably located above the main surface, so that they can be produced from materials with a high electrical conductivity and can be structured together with gate electrodes of transistors of a periphery of the cell configuration.

In accordance with another feature of the invention, the substrate can be a semiconductor substrate. The semiconductor substrate can be, for example, silicon or germanium.

Other features that are considered as characteristic for the invention are set forth in the appended claims.

Although the invention is illustrated and described herein as embodied in a substrate having a depression, which is suitable for an integrated circuit configuration, and method for its fabrication, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1A:
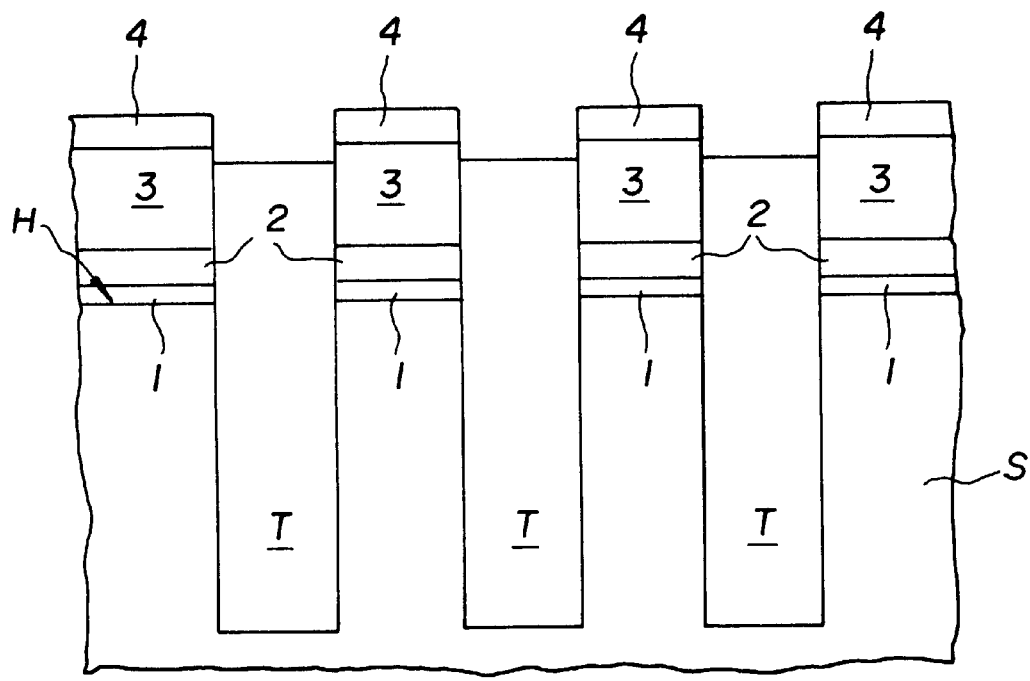
FIG. 1A shows a cross section through a substrate after a first layer, a second layer, a third layer, a fourth layer, and isolating structures have been produced.

The figures are not to scale.

DESCRIPTION OF THE PREFERRED EMBODIMENTS

In all the figures of the drawing, sub-features and integral parts that correspond to one another bear the same reference symbol in each case.

Referring now to the figures of the drawings in detail and first, particularly to FIG. 1A thereof, there is shown an exemplary embodiment. The starting material provided is a p-doped substrate S of silicon which, in a layer adjacent to a main surface H of the substrate S, is p-doped with a dopant concentration of about $10^{18}$ cm$^{-3}$. Deposited on the main surface H are a first layer 1 of $SiO_2$ about 20 nm thick, above that a second layer 2 of silicon nitride about 100 nm thick, above that a third layer 3 of $SiO_2$ about 800 nm thick and above that a fourth layer 4 of silicon nitride about 100 nm thick.

With the aid of a strip-like first photoresist mask (not illustrated), the fourth layer 4, the third layer 3, the second layer 2, the first layer 1, and the substrate S are etched anisotropically. The resulting first trenches that are about 300 nm deep are produced in the substrate S. The first trenches have a width of about 100 nm and distances from one another of about 100 nm. Suitable etching media are, for example, $CF_4$, $CHF_3$, $C_2F_6$, and HBr, which are combined in accordance with the material to be etched.

Isolating structures T are produced in the first trenches by $SiO_2$ being deposited conformally to a thickness of about 200 nm and being planarized by chemical-mechanical polishing until one upper surface of the fourth layer 4 is exposed. $SiO_2$ is then etched back selectively with respect to silicon nitride, so that an upper surface of the isolating structures T lies underneath an upper surface of the third layer 3. See FIG. 1A.

Figure 1B:
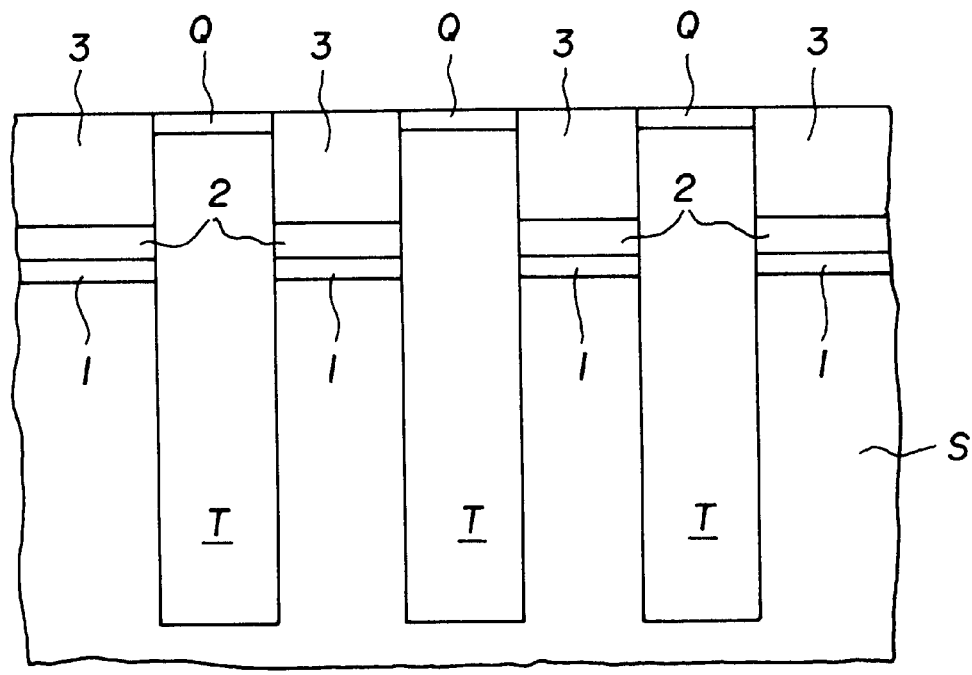
FIG. 1B shows the cross section of FIG. 1A after the fourth layer has been removed and auxiliary structures have been produced.

Silicon nitride is then deposited and planarized by chemical-mechanical polishing until the upper surface of the third layer 3 is exposed. In this way, auxiliary structures Q of silicon nitride are disposed above the isolating structures T. See FIG. 1B.

Figure 2A:
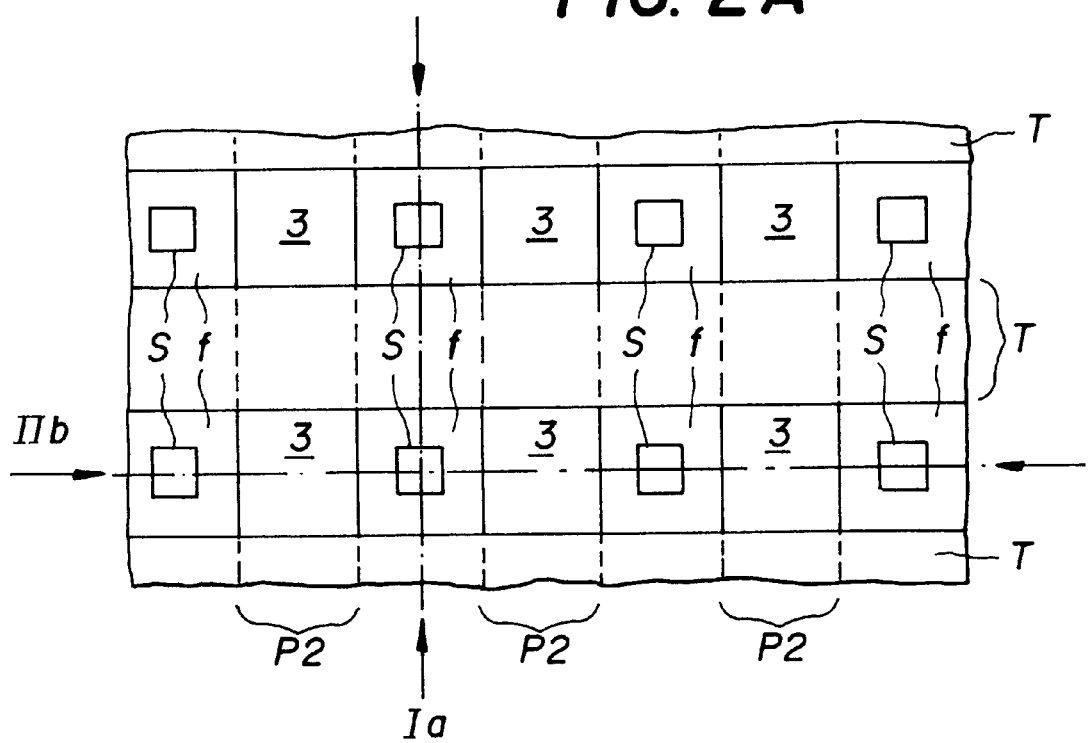
FIG. 2A shows a plan view of the substrate from FIG. 1B after upper regions of depressions and the auxiliary spacers have been produced.
Figure 2B:
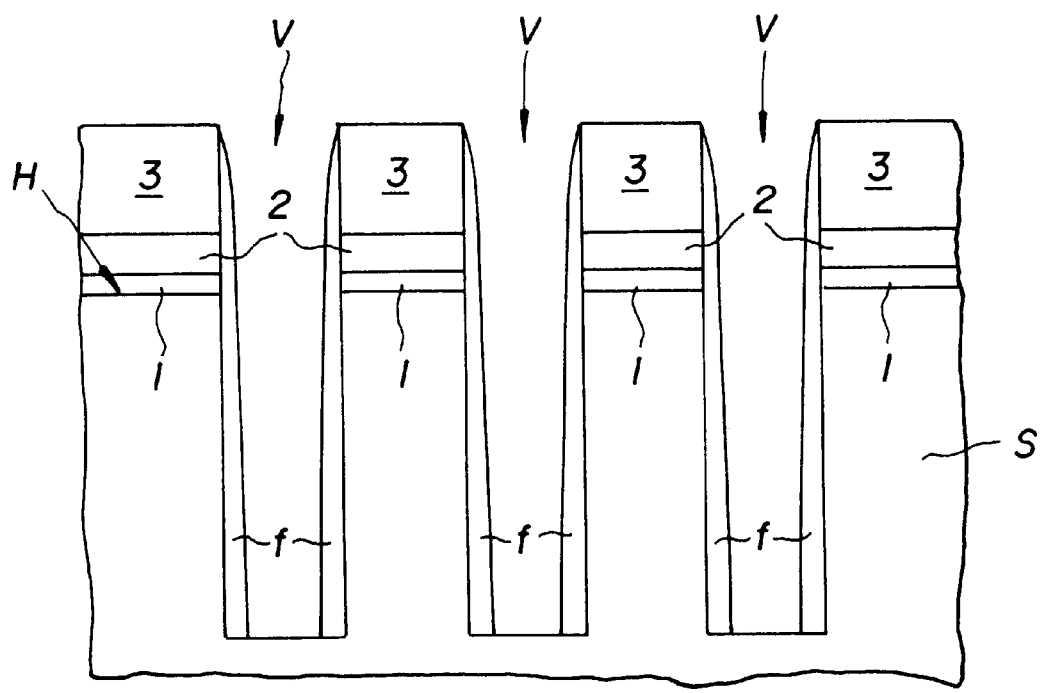
FIG. 2B shows a cross section, at right angles to the cross section of FIG. 1A, through the substrate after the process steps of FIG. 2A.

With the aid of a strip-like second photoresist mask P2 (see FIG. 2A) whose strips run transversely with respect to the strips of the first photoresist mask, $SiO_2$ is etched selectively with respect to silicon nitride, using $C_4F_6$, CO, for example, until the second layer 2 is partially exposed. Silicon nitride is then etched so that the auxiliary structures Q and exposed parts of the second layer 2 are removed. By etching silicon selectively with respect to $SiO_2$, because of the finite selectivity of the etching process, first of all the first layer 1 is partially severed and then upper regions of depressions V are produced. In this case, the isolating structures T and the third layer 3 act as a thick mask. The upper regions of the depressions V are about 300 nm deep in the substrate S and have cross sections which are parallel to the main surface H and are square and whose dimensions are about 100 nm. Distances between mutually adjacent depressions V are about 100 nm. See FIGS. 2A and 2B.

In the depressions V, auxiliary spacers f are produced by $SiO_2$ being deposited to a thickness of about 30 nm and etched back anisotropically. See FIGS. 2A and 2B. Exposed parts of the bases of the depressions are substantially square and have a side length of about 40 nm.

Figure 3:
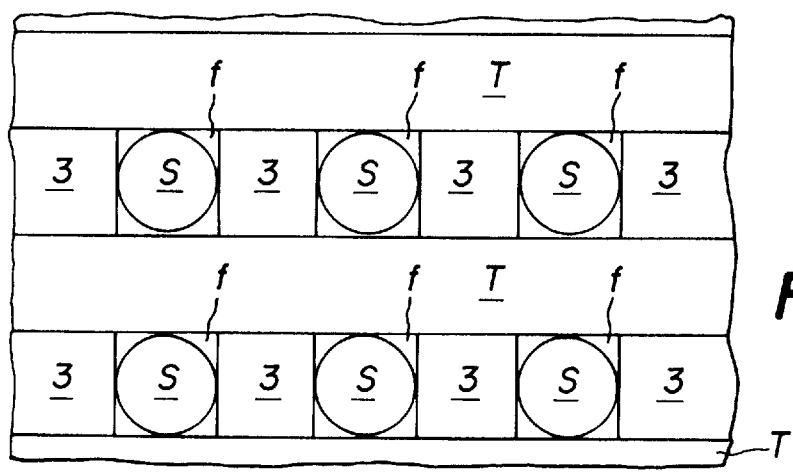
FIG. 3 shows the plan view of FIG. 2A after the auxiliary spacers have been rounded off.

In order to round off the auxiliary spacers f, isotropic etching back with $CF_4$ as etching medium, for example, is then carried out. See FIG. 3. Exposed parts of the bases of the depressions V are substantially circular and have a diameter of about 100 nm.

Figure 4:
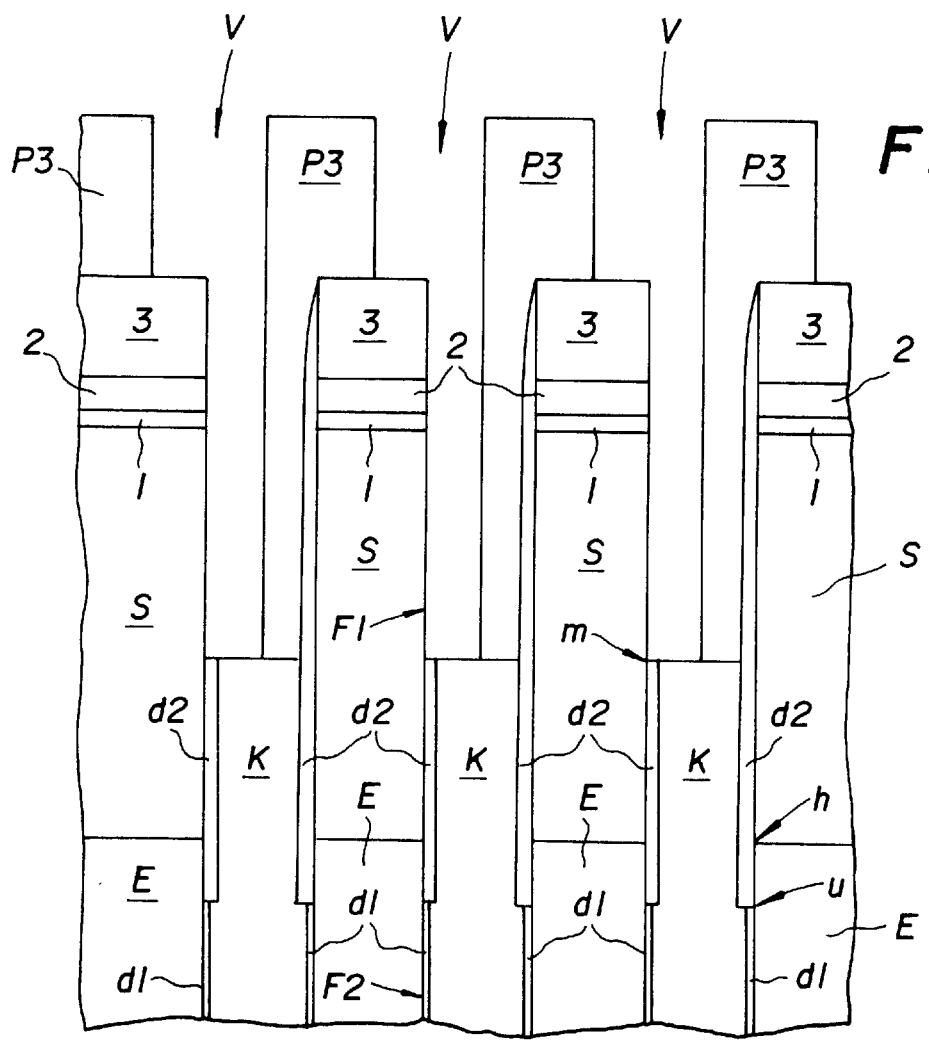
FIG. 4 shows the cross section of FIG. 2B after a lower region of the depression, a capacitor dielectric, a storage node, and a photoresist mask have been produced.

Silicon is then etched anisotropically and selectively with respect to $SiO_2$ using HBr, for example, so that lower regions of the depressions V are produced which, because of the auxiliary spacers f acting as a mask, have circular horizontal cross sections. The depressions V are now about 7 µm deep. See FIG. 4. During the etching process, the isolating structures T and the third layer 3 act as a thick mask.

The upper regions of the depressions V each have four lateral, flat first surfaces F1. The lower regions of the depressions V have a curved second surface F2. A horizontal cross section of the lower region, that is one lying parallel to the main surface H, of one of the depressions V has a curved edge. Part of the substrate S is in particular disposed under corners of the upper regions of the depressions V, because the auxiliary spacers f cover at least the corners and consequently are not etched deeper there. At the transition from the upper region to the lower region, the depression V has indentations.

In order to produce a capacitor electrode E of capacitors, arsenic glass is deposited to a thickness of about 10 nm. The depressions V provided with the arsenic glass are filled with photoresist up to a height h of about 1 µm under the main surface H (cf. FIG. 4). Exposed arsenic glass is then removed. After the photoresist has been removed, a protective oxide (not illustrated) is grown on. The protective oxide prevents the arsenic evaporating during a following tempering step at about 1000° C., at which arsenic diffuses into the substrate S from the arsenic glass. As a result, the capacitor electrode E is produced as part of the substrate S doped with arsenic, and surrounds parts of the lower regions of the depressions V (see FIG. 4). The protective oxide and the auxiliary spacers f are subsequently removed with dilute hydrofluoric acid.

In order to produce the first part d1 of a capacitor dielectric, surfaces of the depressions V are provided with silicon nitride. The silicon nitride is then partially oxidized, so that the first part d1 of the capacitor dielectric is produced as a so-called NO layer with an oxide equivalent thickness of about 3 nm. See FIG. 4.

In order to produce storage nodes K of the capacitors, in-situ doped polysilicon is deposited to a thickness of about 100 nm and planarized by chemical-mechanical polishing until the second layer 2 is exposed. In the process, the third layer 3 is removed and a small part of the isolating structures T is removed. The polysilicon is then etched back by anisotropic etching down to a depth of 1.1 µm underneath the main surface H, so that the depressions V are filled with polysilicon up to a lower level u. See FIG. 4. Exposed parts of the first part d1 of the capacitor dielectric are removed with hydrofluoric acid, for example.

In order to produce a spacer-like second part d2 of the capacitor dielectric in the depressions V, $SiO_2$ is deposited to a thickness of about 15 nm and etched back anisotropically. See FIG. 4. The second part d2 of the capacitor dielectric is thicker than the first part d1.

By depositing in-situ doped polysilicon to a thickness of about 100 nm and subsequently etching back to a depth of about 250 nm underneath the main surface H, the storage nodes K are enlarged. The depressions V are filled with polysilicon up to a middle level m. See FIG. 4.

With the aid of a multilayer third photoresist mask P3 (see FIG. 4), parts of the second part d2 of the capacitor dielectric are removed. On first flanks of the depressions V, the second part d2 of the capacitor dielectric reaches only from the lower level u up to the middle level m.

In-situ doped polysilicon is then deposited in a depth of about 100 nm and planarized by chemical-mechanical polishing until the second layer 2 is exposed.

Underneath the first layer 1, upper source/drain regions S/D1 of vertical transistors, about 30 nm thick, are produced in the substrate S by implantation with n-doping ions. On account of the isolating structures T and the depressions V, the upper source/drain regions S/D1 have square horizontal cross sections with a side length of about 100 nm. Mutually adjacent upper source/drain regions S/D1 are isolated from one another by the isolating structures T or by the depressions V.

Figure 5:
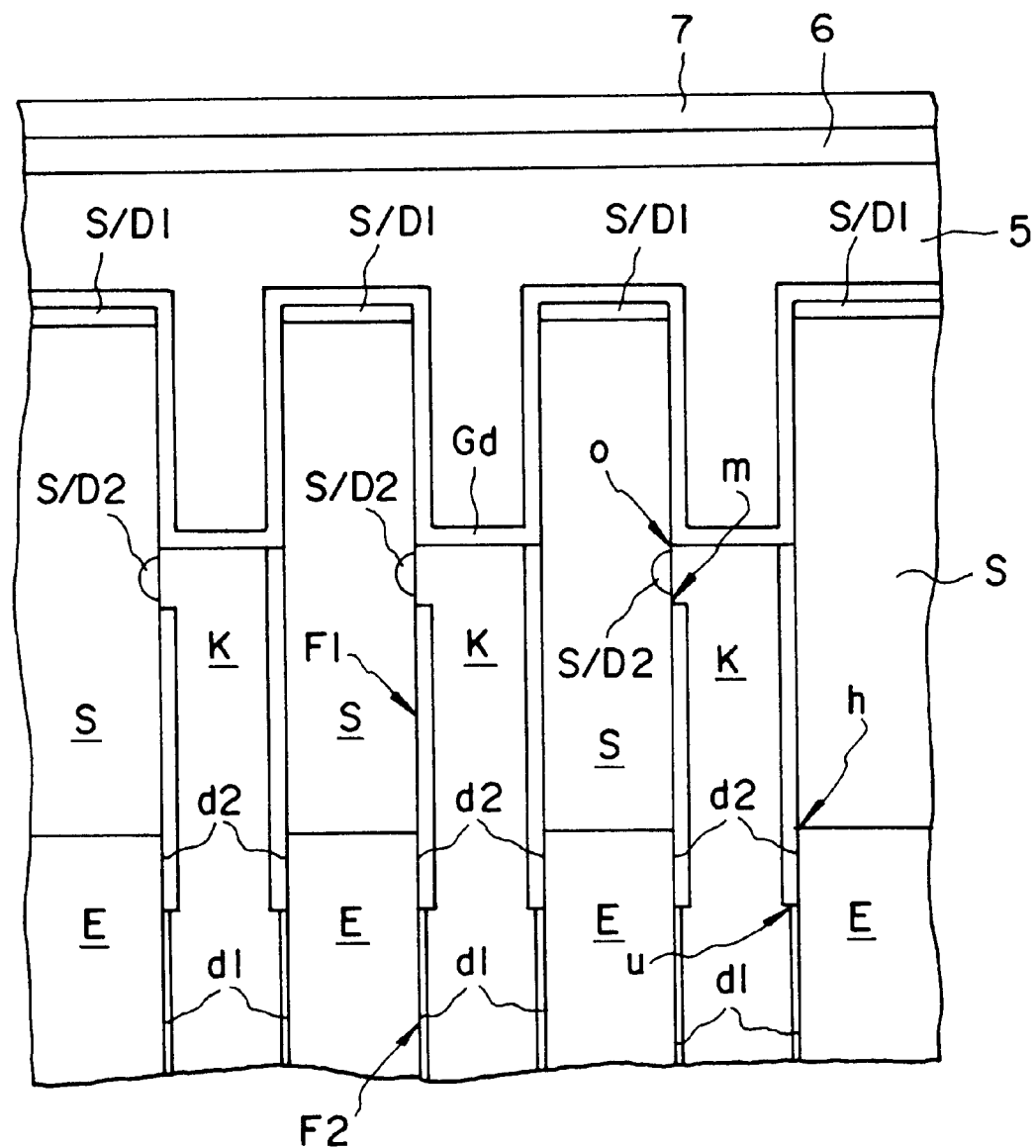
FIG. 5 shows the cross section of FIG. 4 after a gate dielectric, upper source/drain regions, lower source/drain regions, a fifth layer, a sixth layer and a seventh layer have been produced.

The polysilicon is then etched back down to a depth of about 200 nm under the main surface H, so that the storage nodes K are further thickened. The depressions V are filled with polysilicon up to an upper level h (see FIG. 5). The storage nodes K adjoin the substrate S at the first flanks of the depressions V between the middle level m and the upper level o. Upper parts of the storage nodes K are disposed in the upper regions of the depressions V. As a result of a tempering step, dopant diffuses out of the storage node K into the substrate S, so that lower source/drain regions S/D2 of the transistors are produced, adjoining the first flanks of the depressions V in the region between the middle level m and the upper level o.

The second layer 2 is then removed, using white phosphoric acid, for example, as an etching medium.

A gate dielectric Gd is produced with thermal oxidation on flanks of the upper regions of the depressions V, on the main surface H and on the storage nodes K. See FIG. 5.

A fifth layer 5 of in-situ doped polysilicon is then deposited to a thickness of about 60 nm, so that the upper regions of the depressions V are filled. Above this, a sixth layer 6 of tungsten silicide about 50 nm thick and a seventh layer 7 of silicon nitride about 100 nm thick are deposited. See FIG. 5.

Figure 6A:
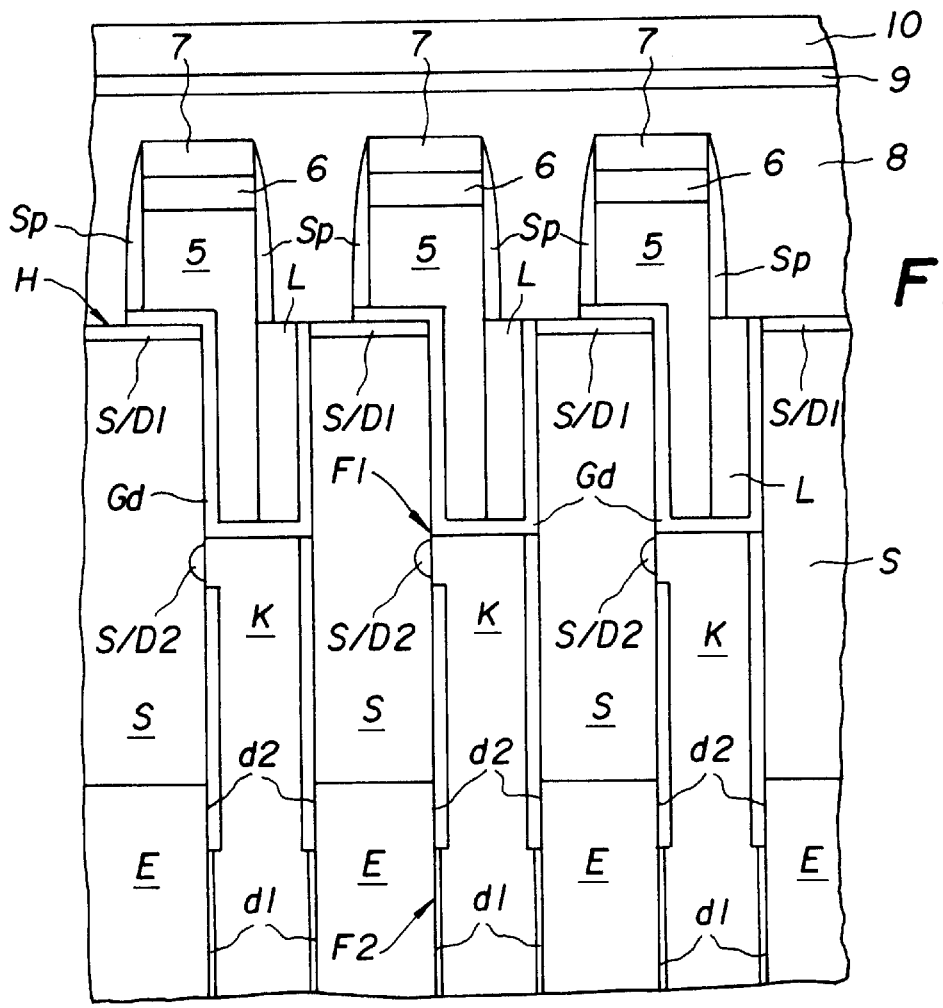
FIG. 6A shows the cross section of FIG. 5 after the fifth layer and the sixth layer have been structured to form word lines, and spacers, insulation (illustrated in FIG. 6B), an eighth layer, and a ninth layer, which form bit lines, and a tenth layer have been produced.

With the aid of a strip-like fourth photoresist mask (not illustrated), whose strips run transversely with respect to the isolating structures T, the seventh layer 7, the sixth layer 6, and the fifth layer 5 are etched until the gate dielectric Gd is exposed. In each case, part of the fifth layer 5 and part of the sixth layer 6 which adjoin each other form a word line, which is covered by the insulating seventh layer 7 (see FIG. 6A). The word lines are about 100 nm wide and have a spacing of about 100 nm from one another. The word lines are disposed so as to be offset with respect to the depressions V, so that first parts of the word lines have a strip-like horizontal cross section and run above parts of the upper source/drain regions S/D1 covered by the gate dielectric Gd. Second parts of the word lines are disposed in the upper regions of the depressions V, on their first flanks. The word lines have a metallic conductivity.

In order to produce insulating structures L in the depressions V, $SiO_2$ is deposited to a thickness of about 50 nm and etched back until the gate dielectric Gd, which is more difficult to etch because of its density, is exposed. See FIG. 6A.

In order to encapsulate the word lines, spacers Sp are produced by silicon nitride being deposited to a thickness of about 15 nm and etched back anisotropically. See FIG. 6A.

Figure 6B:
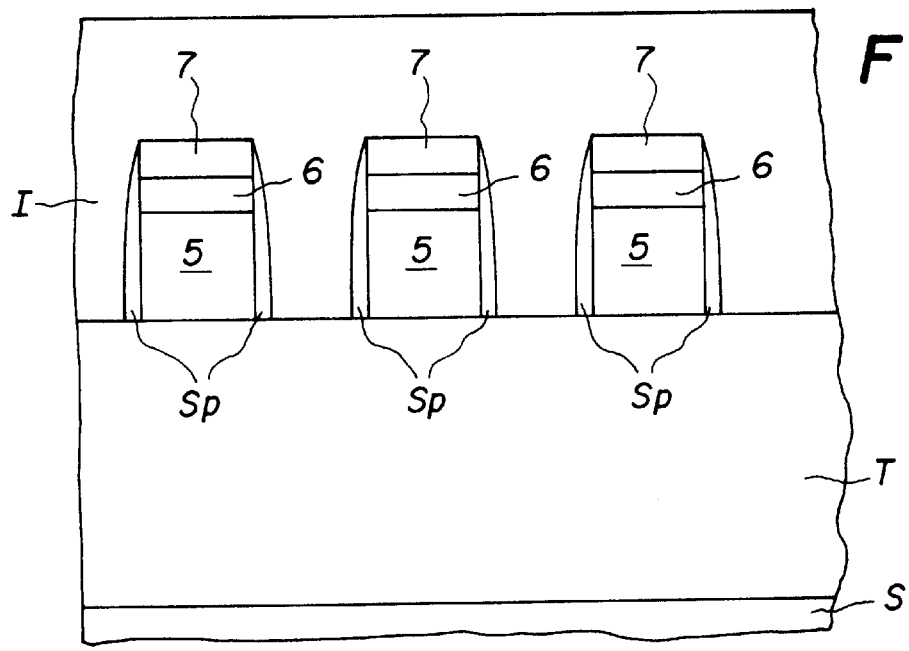
FIG. 6B shows a cross section, parallel to the cross section from FIG. 6A, through the substrate after the process steps from FIG. 6A.

In order to produce insulation I, $SiO_2$ is deposited to a thickness of about 50 nm and planarized by chemical-mechanical polishing, until a flat surface is produced. See FIG. 6B.

With the aid of a strip-like fifth photoresist mask (not illustrated), whose strips are respectively disposed above one of the isolating structures T, SiO₂ is etched until the upper source/drain regions S/D1 are exposed and second trenches are produced in the insulation I. These trenches are particularly deep in the regions between the word lines and form contact holes. See FIG. 6A. In the process, parts of the gate dielectric Gd are removed. The insulating seventh layer 7 and the spacers Sp protect the word lines in the process, so that the result is a large adjustment tolerance for the second trenches.

In order to produce bit lines, an eighth layer 8 of in-situ doped polysilicon is deposited to a thickness of about 50 nm, so that the second trenches are filled. The polysilicon is then etched back until about 30 nm polysilicon is lying over the seventh layer. Above this, a ninth layer 9 of titanium nitride and titanium about 20 nm thick, and a tenth layer 10 of tungsten about 60 nm thick are deposited and planarized by chemical-mechanical polishing until the insulation I is exposed, so that bit lines are produced in a self-adjusted manner in the second trenches from the eighth layer 8, the ninth layer 9 and the tenth layer 10. First parts of the bit lines form strips which run transversely with respect to the word lines, and second parts of the bit lines fill the contact holes and are disposed between mutually adjacent word lines (see FIG. 6A). The bit lines have metallic conductivity.

In the exemplary embodiment, a DRAM cell configuration is produced. A memory cell includes one of the vertical transistors and one of the capacitors, which is connected in series with the transistor. The gate dielectric of the transistor is disposed on one of the flat first surfaces F1. The first part of the capacitor dielectric is disposed on the curved second surface F2.

Parts of the word lines disposed on the first flanks of the upper regions of the depressions V act as gate electrodes of the transistors. The insulating structures L on the second flanks of the depressions V prevent the word line disposed in the depression V driving a transistor which is disposed on a depression V adjacent to the depression V.

Channel regions of the transistors are parts of the substrate S that are disposed between the upper source/drain regions S/D1 and the lower source/drain regions S/D2. The channel regions of the transistors are connected to one another, so that floating-body effects are avoided on account of the sufficiently high dopant concentration of that layer of the substrate S that adjoins the main surface H.

There are many conceivable variations of the exemplary embodiment which likewise lie within the scope of the invention. For example, dimensions of the layers, depressions and structures can be adapted to the respective requirements. The same applies to the dopant concentrations and to the choice of materials. For example, the word lines and the bit lines can also contain other conductive materials than those listed in the exemplary embodiment.

The lower source/drain region of one of the transistors can be divided into two, so that a first part adjoins the first flank and a second part adjoins the second flank of the associated depression. In this case, when the second part of the capacitor dielectric is removed down to the middle level, no mask is used, so that the second part of the capacitor dielectric on the second flanks of the depressions is likewise removed as far as the middle level. The storage node adjoins the substrate both at the first flank and at the second flank.

The insulating structures can be dispensed with if the distance between the second flank of the depression and the lower source/drain region of the transistor of the adjacent depression is sufficiently large.

If the insulating structures are provided, the lower source/drain regions can be produced by structuring a doped layer of the substrate instead of by the outward diffusion of dopant.

The insulating structures can be produced in that, during the encapsulation of the word lines, the silicon nitride is deposited in such a thickness that the depressions are filled. In this case, the insulating structures contain silicon nitride.

We claim:

1. A substrate assembly having a depression that is suitable for an integrated circuit configuration, comprising:
    a substrate having a main surface and a depression formed therein reaching into said substrate from said main surface;
    said depression having:
        an upper region with a substantially square cross-section parallel to said main surface, and having at least one corner;
        a lower region adjacent to said upper region with a substantially circular cross-section parallel to said main surface, said substantially circular cross-section being smaller than said substantially square cross-section and having at least one round section corresponding respectively to said at least one corner of said substantially square cross-section.

2. The substrate assembly according to claim 1, wherein said upper region has dimensions no greater than a minimum structure size producible with the technology used in the manufacture of the substrate assembly.

3. The substrate according to claim 1, wherein:
    said lower region includes a capacitor dielectric and at least part of a storage node of a capacitor;
    said substantially square cross-section has a straight edge adjoining said at least one corner; and
    said upper region has a vertical transistor and a side surface a portion of which is associated with said straight edge, said portion having a gate dielectric and said vertical transistor having a gate electrode adjoining said gate dielectric.

4. The substrate assembly according to claim 3, including:
    a DRAM cell disposed in said substrate having a bit line and a word line;
    said DRAM cell connected to a memory cell formed by said transistor having a lower source/drain region disposed in said substrate said lower source/drain region electrically connecting to said storage node, said transistor and said capacitor connected in series;
    said bit line connecting to said upper source/drain region of said transistor; and
    said word line connecting to said gate electrode.

* * * * *